(12) United States Patent
Lee et al.

(10) Patent No.: US 8,050,130 B2
(45) Date of Patent: Nov. 1, 2011

(54) SEMICONDUCTOR MEMORY DEVICE AND INTERNAL DATA TRANSMISSION METHOD THEREOF

(75) Inventors: Sung-Hyun Lee, Hwaseong-si (KR); Dong-Soo Kang, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 47 days.

(21) Appl. No.: 12/798,644

(22) Filed: Apr. 8, 2010

(65) Prior Publication Data

US 2011/0007583 A1   Jan. 13, 2011

(30) Foreign Application Priority Data

Jul. 7, 2009  (KR) .................. 10-2009-0061826

(51) Int. Cl.
*G11C 8/00*   (2006.01)
(52) U.S. Cl. .......... 365/230.01; 365/230.08; 365/185.21
(58) Field of Classification Search ............. 365/230.01, 365/230.08, 185.21
See application file for complete search history.

(56) References Cited

U.S. PATENT DOCUMENTS

| | | | |
|---|---|---|---|
| 5,682,351 A | 10/1997 | Han | |
| 5,689,473 A * | 11/1997 | Toda | ............................ 365/233.1 |
| 6,324,116 B1 | 11/2001 | Noh et al. | |
| 6,356,484 B2 | 3/2002 | Dosaka et al. | |
| 6,473,828 B1 | 10/2002 | Matsui | |
| 7,366,044 B2 | 4/2008 | Takase | |

FOREIGN PATENT DOCUMENTS

| | | |
|---|---|---|
| JP | 09035483 | 2/1997 |
| JP | 2000156078 | 6/2000 |
| JP | 2004355677 | 12/2004 |
| KR | 100154756 B1 | 7/1998 |

* cited by examiner

*Primary Examiner* — Jason Lappas
(74) *Attorney, Agent, or Firm* — Onello & Mello, LLP

(57) ABSTRACT

In a semiconductor memory device and an internal data transmission method thereof, the device includes a memory controller, a pair of data lines, and a plurality of memory banks. During an internal data transmission operation, the memory controller externally receives and stores a source address and a target address in response to an externally applied command and outputs an internal control signal and an internal address signal using the source address and the target address. The internal control signal includes an internal write signal and an internal read signal. Transmission data is transmitted on the pair of data lines during the internal data transmission operation. The plurality of memory banks read the transmission data stored in a region corresponding to the source address in response to the internal read signal, transmit the transmission data on the pair of data lines, and write the transmission data transmitted on the pair of data lines in response to the internal write signal. During the internal data transmission operation, the transmission data is transmitted from the region corresponding to the source address to a region corresponding to the target address, and is not output external to the semiconductor memory device.

20 Claims, 9 Drawing Sheets

SEMICONDUCTOR MEMORY DEVICE AND INTERNAL DATA TRANSMISSION METHOD THEREOF

CROSS-REFERENCE TO RELATED APPLICATION

This application claims the benefit of Korean Patent Application No. 10-2009-0061826, filed Jul. 7, 2009, the contents of which are hereby incorporated herein by reference in their entirety.

BACKGROUND

1. Field

Example embodiments relate to a semiconductor memory device, and more particularly, to a semiconductor memory device capable of efficiently transmitting data during a memory copy operation in which data stored in a predetermined internal region of the semiconductor memory device is copied to another internal region, and further to an internal data transmission method of the semiconductor memory device.

2. Description of Related Art

In recent years, the need for a memory copy operation, in which data stored in a predetermined internal region of a semiconductor memory device is copied to another internal region, is increasing, and data traffic transmitted during the memory copy operation is also increasing. For example, when a plurality of operating systems are employed on a computer system, data stored in a predetermined internal region of a semiconductor memory device needs to be copied to another internal region thereof. There is a growing tendency to apply a plurality of operating systems on a computer system, and an improvement in the functionality of the operating systems may lead to a rise in data traffic transmitted during a memory copy operation.

SUMMARY

Example embodiments provide a semiconductor memory device capable of efficiently transmitting data during a memory copy operation.

Example embodiments also provide an internal data transmission method of the above-described semiconductor memory device.

According to example embodiments, a semiconductor memory device includes: a memory controller; a pair of data lines; and a plurality of memory banks. During an internal data transmission operation, the memory controller externally receives and stores a source address and a target address in response to an externally applied command and outputs an internal control signal and an internal address signal using the source address and the target address. The internal control signal includes an internal write signal and an internal read signal. Transmission data is transmitted on the pair of data lines during the internal data transmission operation. The plurality of memory banks read the transmission data stored in a region corresponding to the source address in response to the internal read signal, transmit the transmission data on the pair of data lines, and write the transmission data transmitted on the pair of data lines in response to the internal write signal. During the internal data transmission operation, the transmission data is transmitted from the region corresponding to the source address to a region corresponding to the The pair of data lines of the semiconductor memory device may be a global data I/O line and an inverted global data I/O line, and the transmission data may transmitted from the region corresponding to the source address to the region corresponding to the target address during the internal data transmission operation through the global data I/O line and the inverted global data I/O line.

Each of the plurality of memory banks of the semiconductor memory device may include: an address decoder, a memory cell array, a bit line sense amplification unit, and a bit line sense amplification unit. The address decoder may decode the internal address signal and drive word lines and column selection signal lines. The memory cell array may include memory cells connected between bit lines and inverted bit lines selected by the word lines and the column selection signal lines, respectively. The bit line sense amplification unit may include an NMOS sense amplifier and a PMOS sense amplifier. The NMOS sense amplifier may sense a high-level signal of the bit line or the inverted bit line and amplify a signal of an inverted local data input/output (I/O) line or a local data I/O line to a low level. The PMOS sense amplifier may sense a low-level signal of the bit line or the inverted bit line and amplify the signal of the inverted local data I/O line or the local data I/O line to a high level. The local sense amplification unit may sense the high-level signal of the local data I/O line or the inverted local data I/O line and amplify a signal of an inverted global data I/O line or a global data I/O line to a low level in response to the internal read signal, and connect the local data I/O line and the inverted local data I/O line with the global data I/O line and the inverted global data I/O line, respectively, in response to the internal write signal.

The memory controller may output the internal control signal and the internal address signal during the internal data transmission operation to read the transmission data from the region corresponding to the source address, transmit the transmission data through the global data I/O line and the inverted global data I/O line to temporarily store the transmission data in the bit line sense amplification unit of the memory bank that does not include the region corresponding to the source address or the target address, and transmit the temporarily stored transmission data through the global data I/O line and the inverted global data I/O line to write the data to the region corresponding to the target address.

The device may further comprise an internal data transmission line and an inverted internal data transmission line, wherein the pair of data lines are the internal data transmission line and the inverted internal data transmission line, and the transmission data is transmitted from the region corresponding to the source address to a region corresponding to the target address through the internal data transmission line and the inverted internal data transmission line during the internal data transmission operation.

The memory controller may further output a normal read signal and a normal write signal in response to the command during a normal operation, wherein each of the plurality of memory banks comprises: an address decoder configured to decode the internal address signal and to drive word lines and column selection signal lines; a memory cell array including memory cells connected between bit lines and inverted bit lines selected by the word lines and the column selection signal lines, respectively; a bit line sense amplification unit including an NMOS sense amplifier and a PMOS sense amplifier, wherein the NMOS sense amplifier senses a high-level signal of the bit line or the inverted bit line and amplifies a signal of an inverted local data I/O line or a local data I/O line to a low level, and the PMOS sense amplifier senses a low-level signal of the bit line or the inverted bit line and amplifies the signal of the inverted local data I/O line or the local data I/O line to a high level; and a local sense amplification unit including a local sense amplifier and a local global gate, wherein the local sense amplifier is configured to sense a high-level signal of the local data I/O line or the inverted local data I/O line and amplify a signal of an inverted global data I/O line or a global data I/O line to a low level in response to the normal read signal during the normal operation, and configured to sense the high-level signal of the local data I/O line or the inverted local data I/O line and amplify a signal of the inverted internal data transmission line or the internal data transmission line to a low level in response to the internal read signal during the internal data transmission operation, and the local global gate is configured to connect the local data I/O line and the inverted local data I/O line with the global data I/O line and the inverted global data I/O line, respectively, in response to the normal write signal during the normal operation, and configured to connect the local data I/O line and the inverted local data I/O line with the internal data transmission line and the inverted internal data transmission line, respectively, in response to the internal write signal during the internal data transmission operation.

The memory controller may be configured to output the internal control signal and the internal address signal during the internal data transmission operation to read the transmission data from the region corresponding to the source address, to transmit the transmission data through the internal data transmission line and the inverted internal data transmission line to temporarily store the transmission data in the bit line sense amplification unit of the memory bank that does not include the region corresponding to the source address or the target address, and to transmit the temporarily stored transmission data through the internal data transmission line and the inverted internal data transmission line to write the data to the region corresponding to the target address.

The semiconductor memory device may further include a buffer memory connected to the internal data transmission line and the inverted internal data transmission line. According to the remaining example embodiments, the memory controller may output the internal control signal and the internal address signal during the internal data transmission operation to read the transmission data from the region corresponding to the source address, transmit the transmission data through the internal data transmission line and the inverted internal data transmission line, temporarily store the transmission data in the buffer memory, transmit the temporarily stored transmission data through the internal data transmission line and the inverted internal data transmission line, and write the data to the region corresponding to the target address.

The memory controller of the semiconductor memory device may include: an address register; and a command decoder. The address register may externally receive an address signal in response to the command and store the source address and the target address. The command decoder may output the internal control signal and the internal address signal using the source address and the target address, which are stored in the address register, in response to the command.

The memory controller of the semiconductor memory device may further include: a transmission length register; and a mode register. The transmission length register may receive the address signal in response to the command and store a transmission length to determine the size of the transmission data. The mode register may receive the address signal in response to the command and store a mode control signal to determine whether or not an internal data transmission function is to be used. In this case, the command decoder may further employ the transmission length and the mode control signal and output the internal control signal and the internal address signal.

According to other example embodiments, a method of transmitting internal data in a semiconductor memory device including a memory controller and a plurality of memory banks includes: an initialization operation of externally receiving a source address and a target address and storing the source address and the target address in the memory controller in response to an externally applied command; a data read operation of reading transmission data stored in a region corresponding to the source address out of the plurality of memory banks and transmitting the transmission data to a pair of data lines; and a data write operation of writing the transmission data transmitted to the pair of data lines to a region corresponding to the target address out of the plurality of memory banks. The transmission data is not output external to the semiconductor memory device.

The method may further include a data temporary storage operation of temporarily storing the transmission data transmitted through the pair of data lines during the data read operation in a bit line sense amplifier of a memory bank, which does not include the region corresponding to the source address or the target address, out of the plurality of memory banks or a buffer memory connected to the pair of data lines and transmitting the temporarily stored transmission data through the pair of data lines.

The data read operation may include transmitting the transmission data through a pair of global data I/O lines or a pair of internal data transmission lines, and the data write operation may include writing the transmission data transmitted through the pair of global data I/O lines or the pair of internal data transmission lines.

The data read operation may include: a bit line sense amplification operation of transmitting the transmission data stored in the region corresponding to the source address to a pair of bit lines, amplifying signals of the pair of bit lines, and transmitting the amplified signals of the pair of bit lines through a pair of local data I/O lines; and a local sense amplification operation of amplifying the transmission data transmitted through the pair of local data I/O lines and transmitting the amplified transmission data through the pair of data lines. The data write operation may include: a gate operation of transmitting the transmission data transmitted through the pair of data lines to the pair of local data I/O lines; and a write operation of transmitting the transmission data transmitted through the pair of local data I/O lines to the pair of bit lines and writing the transmission data to the region corresponding to the target address.

The initialization operation may include receiving and storing a transmission length and a mode control signal in response to the command. In this case, the transmission length may be used to determine the size of the transmission data, and the mode control signal may be used to determine whether or not an internal data transmission function is to be used.

BRIEF DESCRIPTION OF THE DRAWINGS

Example embodiments are described in further detail below with reference to the accompanying drawings. It should be understood that various aspects of the drawings may have been exaggerated for clarity.

DETAILED DESCRIPTION OF EMBODIMENTS

Figure 1:
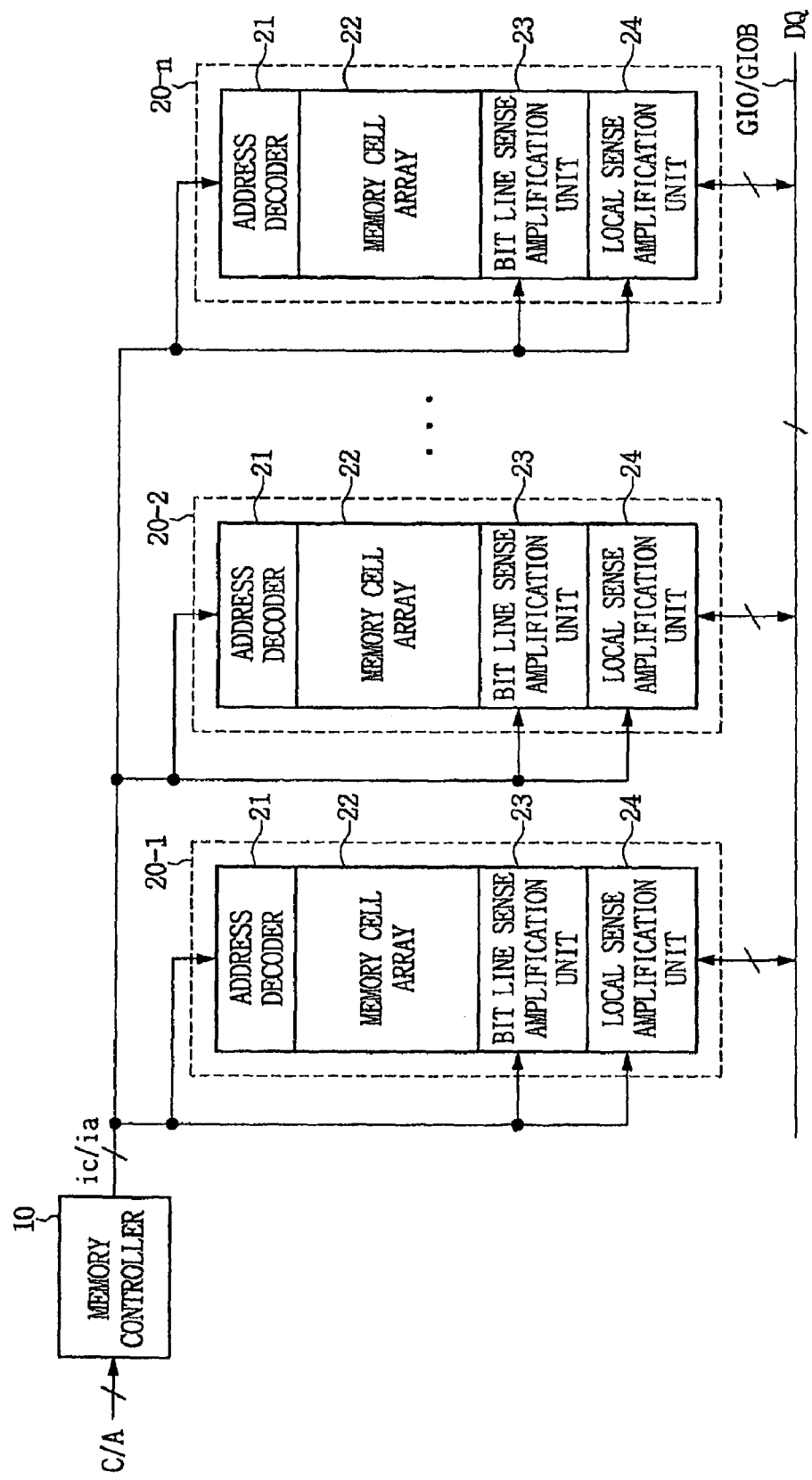
FIG. 1 is a construction diagram of a semiconductor memory device according to example embodiments.

Various exemplary embodiments will be described more fully hereinafter with reference to the accompanying drawings, in which some exemplary embodiments are shown. The present inventive concept may, however, be embodied in many different forms and should not be construed as limited to the exemplary embodiments set forth herein.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

FIG. 1 is a construction diagram of a semiconductor memory device according to example embodiments.

Referring to FIG. 1, a semiconductor memory device can include a memory controller 10, a plurality of memory banks 20-1, 20-2, . . . , and 20-n, and a pair of global data input/output (I/O) lines GIO/GIOB. Each of the plurality of memory banks 20-1, 20-2, . . . , and 20-n can include an address decoder 21, a memory cell array 22, a bit line sense amplification unit 23, and a local sense amplification unit 24.

Functions of respective blocks of FIG. 1 will now be described.

The memory controller 10 can output an internal control signal ic and an internal address signal ia in response to externally applied command and address signals C/A. When the semiconductor memory device performs an internal data transmission operation, the memory controller 10 can be configured to sequentially output the internal control signal ic and the internal address signal ia in response to the command and address signals C/A that are externally applied in sequence. Alternatively, the memory controller 10 can be configured to sequentially output the internal control signal ic and the internal address signal ia in response to an externally applied internal data transmission command.

Each of the plurality of memory banks 20-1, 20-2, . . . , and 20-n may be configured to store data DQ, which is received through the global data I/O line GIO and output the stored data DQ through the global data I/O line GIO in response to the internal control signal ic and the internal address signal ia. During the internal data transmission operation, one of the memory banks 20-1, 20-2, . . . , and 20-n may output data in response to the internal control signal ic and the internal address signal ia, and another one of the memory banks 20-1, 20-2, . . . , and 20-n may store the output data or temporarily store the output data in the bit line sense amplification unit 23 and output the temporarily stored data in response to the internal control signal ic and the internal address signal ia.

The address decoder 21 may decode the internal address signal ia output by the memory controller 10 and select and drive a word line and/or a column selection signal line of the memory cell array 22.

The memory cell array 22 may include a plurality of memory cells connected between word lines and bit lines. The memory cell array 22 may store data in memory cells connected between a selected word line and a bit line selected by a selected column selection signal line or output data stored in the memory cells connected between the selected word line and the bit line selected by the selected column selection signal line.

The bit line sense amplification unit 23 may amplify and output the data, which is output from the memory cell of the memory cell array 22, in response to the internal control signal ic and the internal address signal ia output by the memory controller 10. Also, the bit line sense amplification unit 23 may function to temporarily store data during the internal data transmission operation.

The local sense amplification unit 24 may amplify the data, which is output by the bit line sense amplification unit 23 and transmit the amplified data to the pair of global data I/O lines GIO/GIOB or transmit the data from the pair of global data I/O lines GIO/GIOB to the bit line sense amplification unit 23 in response to the internal control signal ic and the internal address signal ia output by the memory controller 10.

Figure 2:
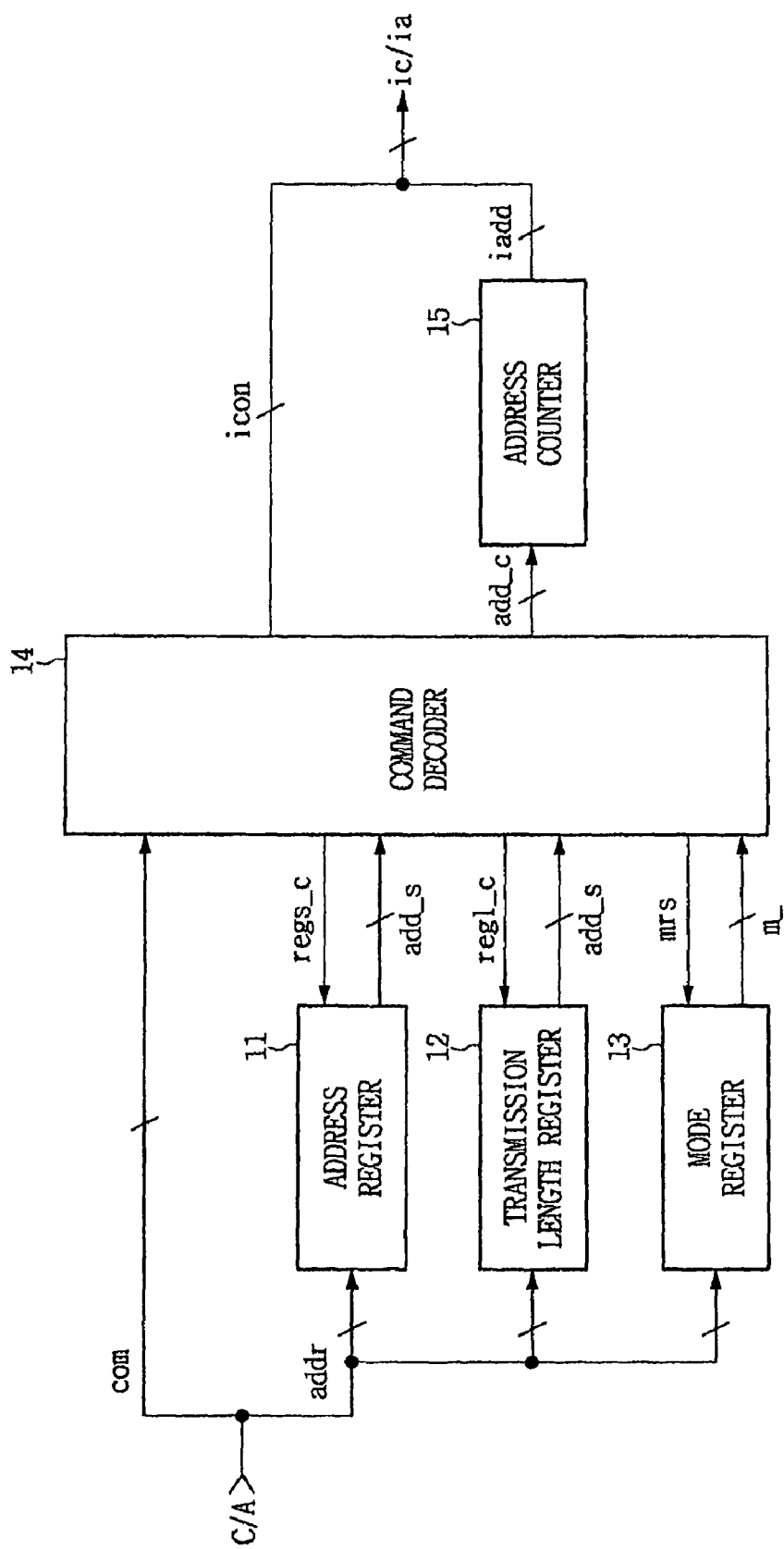
FIG. 2 is a construction diagram of a controller of the semiconductor memory device of FIG. 1, according to example embodiments.

FIG. 2 is a construction diagram of the memory controller 10 of FIG. 1, according to example embodiments.

Referring to FIG. 2, the memory controller 10 may include an address register 11, a transmission length register 12, a mode register 13, a command decoder 14, and an address counter 15.

Functions of respective blocks of FIG. 2 will now be described.

The address register 11 may receive an address signal addr component of the externally applied command and address signals C/A and store a start address (i.e., source address) of a memory cell array that stores data to be transmitted during an internal data transmission operation. The address register 11 may be configured to receive the address signal addr and store the address signal addr in the start address in response to an address register control signal regs_c output by the command decoder 14. Also, the address register 11 may be configured to store not only a start address (i.e., source address) of a memory cell array, which stores data to be copied, but also a start address (i.e., target address) of a memory cell array to which data is to be copied.

The transmission length register 12 may receive the address signal addr component of the externally applied command and address signals C/A and store a transmission length of data to be transmitted during the internal data transmission operation. The transmission length register 12 may receive the address signal addr and store the address signal addr as the transmission length in response to a transmission length register control signal regl_c output by the command decoder 14.

The mode register 13 may receive the address signal addr component of the externally applied command and address signals C/A and set an operating mode of the semiconductor memory device. The mode register 13 may be configured to receive the address signal addr and store the address signal addr as a mode control signal in response to a mode register set (MRS) signal mrs output by the command decoder 14, and output the mode control signal to set the operating mode of the semiconductor memory device. Also, the mode register 13 may determine whether or not the semiconductor memory device is intended to enable an internal data transmission function according to the present embodiments. For example, the mode register 13 may enable the internal data transmission function when a data value of 1 is stored in a specific bit of the mode register 13, and disable the internal data transmission function when a data value of 0 is stored in the specific bit of the mode register 13.

The command decoder 14 may receive a command signal com component of the externally applied command and address signal C/A, decode the command signal com, and output an internal control signal icon. Also, the command decoder 14 may be configured to decode the command signal com to output an address register control signal refs_c, a transmission length register control signal regl_c, and the MRS signal mrs.

Also, the command decoder 14 may be configured to output the source address or target address, which is stored in the address register 11, as a count address add_c to the address counter 15 in response to the command signal com. Although not shown, the command decoder 14 may be configured to control the address counter 15 in response to the command signal com and the transmission length stored in the transmission length register 12. That is, during the internal data transmission operation, the command decoder 14 may receive the command signal com, the source address or target address stored in the address register 11, and the transmission length stored in the transmission length register 12 and control the address counter 15 to sequentially output the source address or target address, for example through an address obtained by adding the transmission length to the source address or target address.

During the internal data transmission operation, the address counter 15 may receive the count address add_c from the command decoder 14, perform a count operation, and output an internal address signal iadd. Specifically, the address counter 15 may output the internal address signal iadd, which is obtained by sequentially increasing the count address add_c by 1, during the internal data transmission operation.

Although FIG. 2 illustrates the address counter 15 separately from the command decoder 14 for brevity, the command decoder 14 may additionally be configured to perform the function of the address counter 15.

Figure 3:
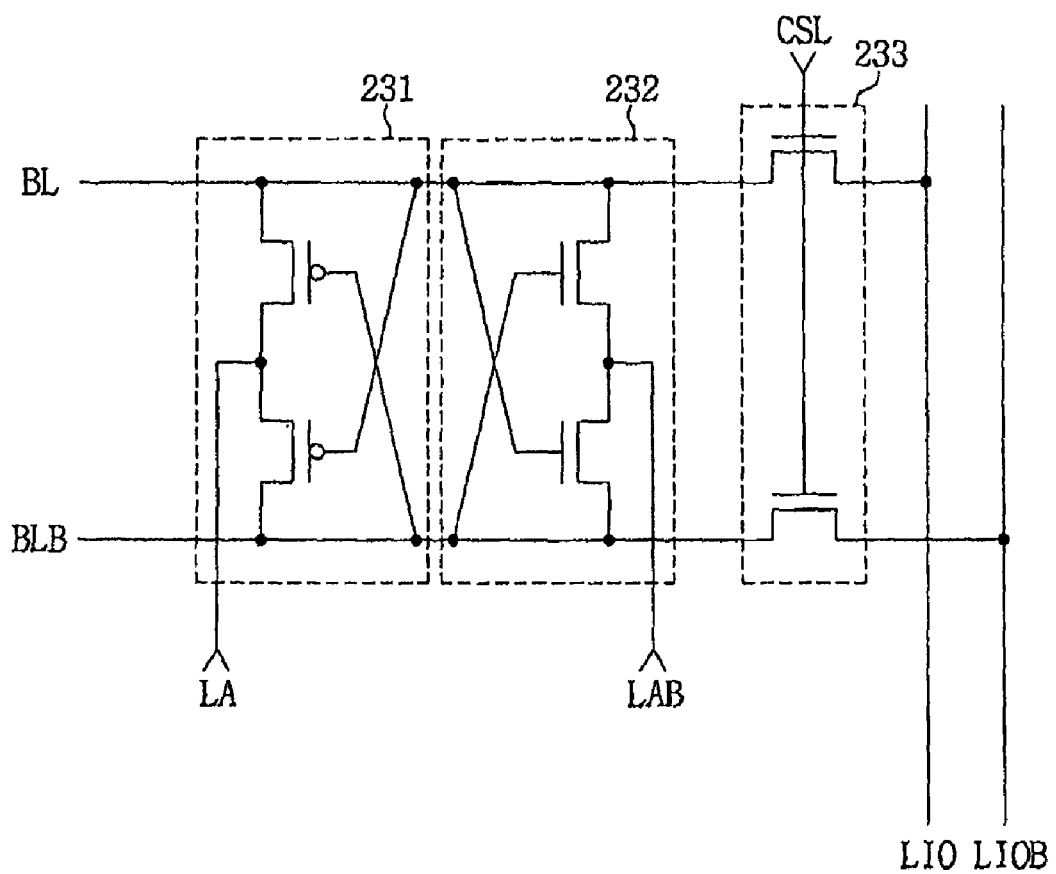
FIG. 3 is a construction diagram of a bit line sense amplifier of the semiconductor memory device of FIG. 1, according to example embodiments.

FIG. 3 is a construction diagram of the bit line sense amplification unit 23 of each of the memory banks 20-1, 20-2, . . . , and 20-n of FIG. 1, according to example embodiments.

Referring to FIG. 3, the bit line sense amplification unit 23 may include a PMOS sense amplifier 231, an NMOS sense amplifier 232, and a column selection gate 233.

Functions of respective blocks of FIG. 3 will now be described.

The PMOS sense amplifier 231 may sense a low-level signal of a bit line or an inverted bit and amplify the signal of the bit line or the inverted bit line to a high level line in response to a high-level sense amplifier enable signal LA.

The NMOS sense amplifier 232 may sense a high-level signal of the bit line or the inverted bit and amplify the signal of the bit line or the inverted bit line to a low level line in response to a low-level inverted sense amplifier enable signal LAB.

The sense amplifier enable signal LA and the inverted sense amplifier enable signal LAB may be output by the memory controller 10. That is, the internal control signal icon may include the sense amplifier enable signal LA and the inverted sense amplifier enable signal LAB.

Also, the PMOS sense amplifier 231 and the NMOS sense amplifier 232 may function as buffers during the internal data transmission operation. That is, during the internal data transmission operation, data transmitted through the pair of global data I/O lines GIO/GIOB may be transmitted through a pair of local data I/O lines LIO/LIOB and a pair of bit lines BL/BLB to the bit line sense amplification unit 23. In this case, when the sense amplifier enable signal LA remains enabled at a high level and the inverted sense amplifier enable signal LAB remains enabled at a low level, the PMOS sense amplifier 231 and the NMOS sense amplifier 232 may function as buffers.

The column selection gate 233 may transmit data between the pair of bit lines BL/BLB and the pair of local data I/O lines LIO/LIOB in response to a column selection signal CSL. The column selection signal CSL may be output by the address decoder 21.

Figure 4:
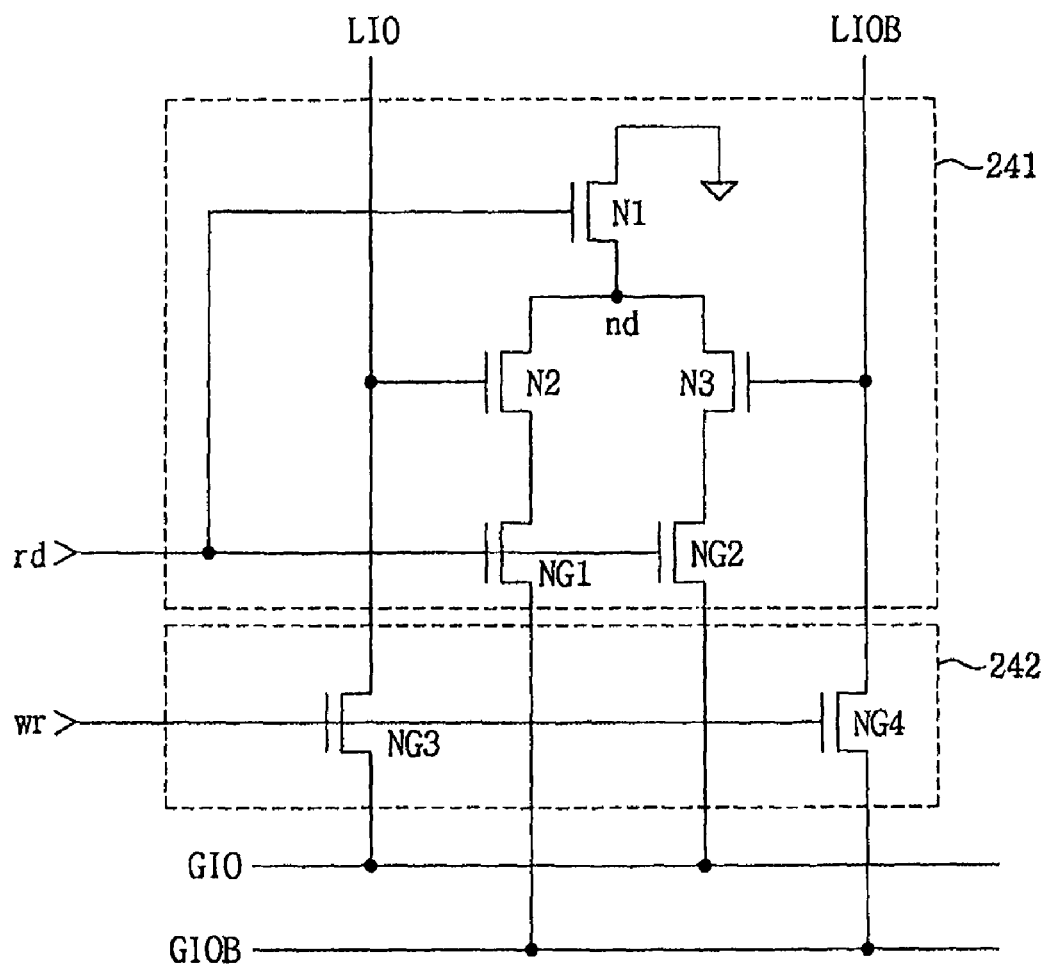
FIG. 4 is a construction diagram of a local sense amplifier of the semiconductor memory device of FIG. 1, according to example embodiments.

FIG. 4 is a construction diagram of the local sense amplification unit 24 of each of the memory banks 20-1, 20-2, . . . , and 20-n of FIG. 1, according to example embodiments.

Referring to FIG. 4, the local sense amplification unit 24 may include a local sense amplifier 241 and a local global gate 242. Also, the local sense amplifier 241 may include first through third NMOS transistors N1, N2, and N3 and first and second NMOS gate transistors NG1 and NG2. The first NMOS transistor N1 may be connected between a ground voltage and a node nd and have a gate to which a read signal rd is applied. The second NMOS transistor N2 may be connected to the node nd and have a gate to which a signal of the local data I/O line LIO is applied. The third NMOS transistor N3 may be connected to the node nd and have a gate to which a signal of the inverted local data I/O line LIOB is applied. The first NMOS gate transistor NG1 may be connected between the second NMOS transistor N2 and the inverted global data I/O line GIOB and have a gate to which the read signal rd is applied. The second NMOS gate transistor NG2 may be connected between the third NMOS transistor N3 and the global data I/O line GIO and have a gate to which the read signal rd is applied. Also, the local global gate 242 may include a third NMOS gate transistor NG3 and a fourth NMOS gate transistor NG4. The third NMOS gate transistor NG3 may be connected between the local data I/O line LIO and the global data I/O line GIO and have a gate to which a write signal wr is applied. The fourth NMOS gate transistor NG4 may be connected between the inverted local data I/O line LIOB and the inverted global data I/O line GIOB and have a gate to which the write signal wr is applied. The read signal rd and the write signal wr may be output by the memory controller 10. That is, the internal control signal icon may include the read signal rd and the write signal wr.

Functions of respective blocks of FIG. 4 will now be described.

During a read operation, the local sense amplifier 241 may sense a high-level signal of the local data I/O line LIO or the inverted local data I/O line LIOB and amplify a signal of the inverted global data I/O line GIOB or the global data I/O line GIO to a low level in response to the read signal rd. Although not shown in FIG. 4, the semiconductor memory device according to the present embodiments may include a global data I/O line precharge unit (not shown), which may precharge the pair of global data I/O lines GIO and GIOB to a high level before the read operation.

During a write operation, the local global gate 242 may transmit data from the pair of global data I/O lines GIO and GIOB to the pair of local data I/O lines LIO and LIOB in response to the write signal wr.

That is, in the semiconductor memory device of FIGS. 1 through 4 according to the present embodiments, data may be transmitted through the pair of global data I/O lines GIO and GIOB during the internal data transmission operation. Also, the bit line sense amplification unit 23 of one of the plurality of memory banks 20-1, 20-2, . . . , and 20-n may function as a buffer during the internal data transmission operation.

An internal data transmission operation of one memory bank (e.g., 20-1) will now be described.

The memory controller 10 may output internal control and address signals ic/ia for reading data stored in a region corresponding to the source address of the memory cell array 22 of the memory bank 20-1. That is, the memory controller 10 may enable the bit line sense amplification unit 23 of the memory bank 20-1 and enable the local sense amplifier 241 of the local sense amplification unit 24 of the memory bank 20-1.

Also, the memory controller 10 may output internal control and address signals ic/ia for temporarily storing data in the PMOS sense amplifier 231 and the NMOS sense amplifier 232 of the bit line sense amplification unit 23 of another memory bank (e.g., 20-2). That is, the memory controller 10 may turn on the local global gate 242 of the local sense amplification unit 24 of the memory bank 20-2 and enable the bit line sense amplification unit 23 of the memory bank 20-2. Thus, data stored in the memory cell array 22 of the memory bank 20-1 may be transmitted through the pair of global data I/O lines GIO and GIOB and temporarily stored in the bit line sense amplification unit 23 of the memory bank 20-2. In this case, the memory controller 10 may optionally control the address decoder 21 to not drive a word line (not shown) of the memory bank 20-2, thereby preventing a change in data of the memory cell array 22 of the memory bank 20-2.

Next, the memory controller 10 may output internal control and address signals ic/ia to write data, which is temporarily stored in the bit line sense amplification unit 23 of the memory bank 20-2, to a region corresponding to the target address of the memory cell array 22 of the memory bank 20-1. That is, the memory controller 10 may enable the local sense amplifier 241 of the local sense amplification unit 24 of the memory bank 20-2, turn on the local global gate 242 of the local sense amplification unit 24, and drive the word line (not shown) of the memory cell array 22 of the memory bank 20-1 to which data is to be copied. Thus, the data temporarily stored in the bit line sense amplification unit 23 of the memory bank 20-2 may be transmitted through the pair of global data I/O lines GIO and GIOB and stored in the region corresponding to the target address of the memory cell array 22 of the memory bank 20-1. Before the temporarily stored data is stored in the region corresponding to the target address, the memory controller 10 may drive the global data I/O line precharge unit to precharge the pair of global data I/O lines GIO and GIOB to a high level.

An operation of copying data stored in one memory bank (e.g., 20-1) to another memory bank (e.g., 20-3) may be performed in nearly the same manner as the above-described operation of copying data in one memory bank. In this case, the bit line sense amplification unit 23 of a memory bank (e.g., 20-2) other than the memory banks including the region corresponding to the source address or target address (e.g., the memory banks 20-1 and 20-3) may be used as a buffer.

Furthermore, when data stored in one memory bank (e.g., 20-1) is copied to another memory bank (e.g., 20-3), the semiconductor memory device according to the present embodiments may be configured not to temporarily store the data, but rather, to directly copy the data. Specifically, the memory controller 10 may output the internal address signal is to the address decoder 21 of the memory bank 20-1 to drive the word line of the memory cell array 22 of the memory bank 20-1 in which data to be copied is stored, enable the bit line sense amplification unit 23 of the memory bank 20-1, and enable the local sense amplifier 241 of the local sense amplification unit 24 of the memory bank 20-1. Also, the memory controller 10 may turn on the local global gate 242 of the local sense amplification unit 24 of the memory bank 20-2 and output the internal address signal is to the address decoder 21 of the memory bank 20-3 to drive the word line of the memory cell array 22 of the memory bank 20-3 to which data is to be copied.

In other words, during the internal transmission operation of the semiconductor memory device according to the present embodiments, during certain modes of operation, transmitted data is not externally output, but is instead copied from the region corresponding to the source address to the region corresponding to the target address through the pair of global data I/O lines GIO and GIOB in the semiconductor memory device.

Figure 5:
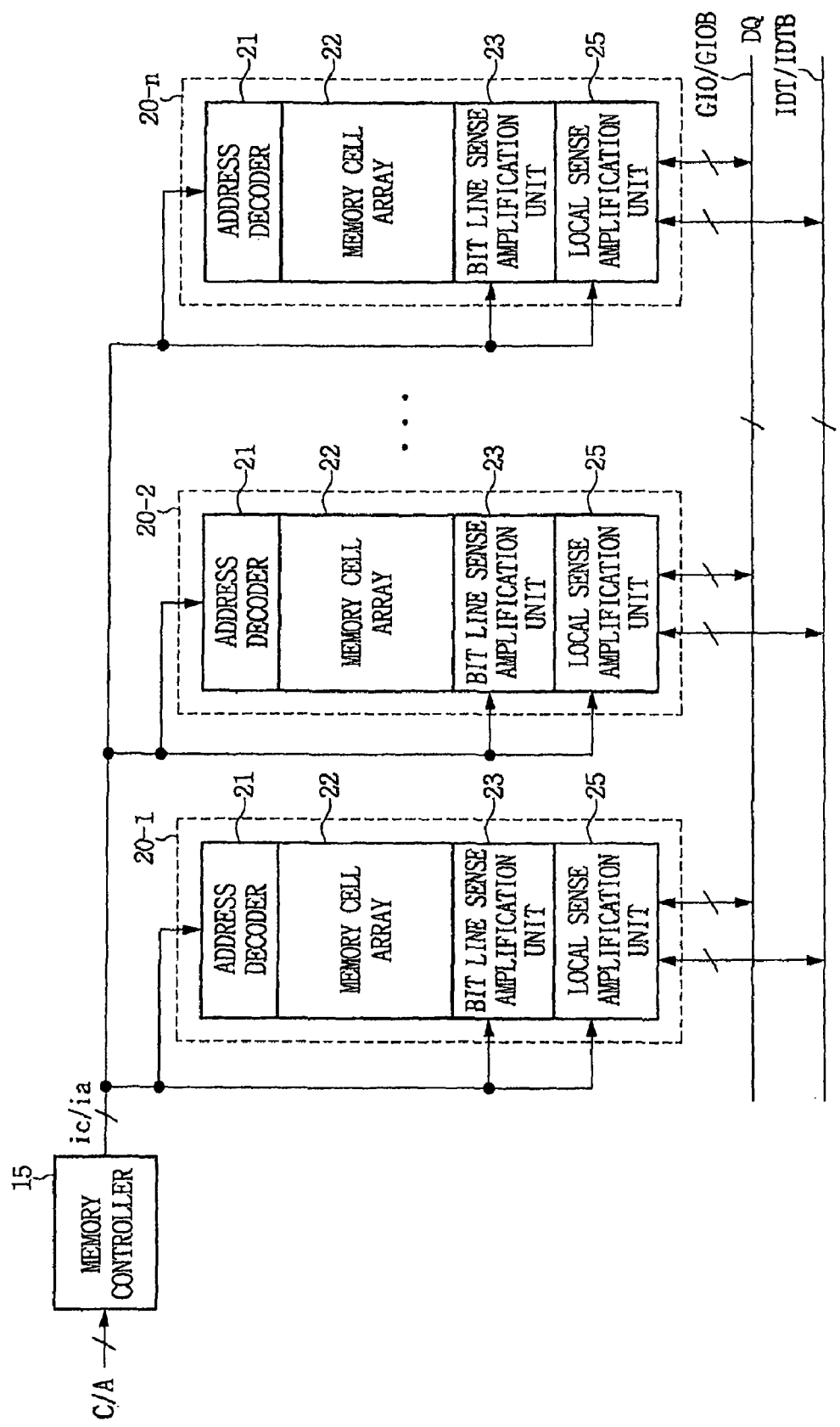
FIG. 5 is a construction diagram of a semiconductor memory device according to other example embodiments.

FIG. 5 is a construction diagram of a semiconductor memory device according to other example embodiments.

Referring to FIG. 5, the semiconductor memory device may include a memory controller 15, a plurality of memory banks 20-1, 20-2, . . . , and 20-n, a pair of global data I/O lines GIO/GIOB, and a pair of internal data transmission lines IDT/IDTB. Also, each of the plurality of memory banks 20-1, 20-2, . . . , and 20-n may include an address decoder 21, a memory cell array 22, a bit line sense amplification unit 23, and a local sense amplification unit 25.

Functions of respective blocks of FIG. 5 will now be described.

The functions of the memory controller 15 and the respective memory banks 20-1, 20-2, . . . , and 20-n will be readily understood with reference to the description of FIG. 1. Also, the memory controller 15 may have the same configuration as in FIG. 2.

Furthermore, the functions of the address decoder 21, the memory cell array 22, and the bit line sense amplification unit 23 will be readily understood with reference to the description of FIG. 1. Also, the bit line sense amplification unit 23 may have the same configuration as in FIG. 3.

The local sense amplification unit 25 may amplify data transmitted to the pair of local data I/O lines LIO/LIOB and transmit the amplified data to the pair of global data I/O lines GIO/GIOB during a read operation. In addition, the local sense amplification unit 25 may transmit data, which is transmitted to the pair of global data I/O lines GIO/GIOB, to the pair of local data I/O lines LIO/LIOB during a write operation. Furthermore, during an internal data transmission operation, the local sense amplification unit 25 may amplify data transmitted to the pair of local data I/O lines LIO/LIOB and transmit the amplified data to the pair of internal data transmission lines IDT/IDTB or transmit data, which is transmitted to the pair of internal data transmission lines IDT/IDTB, to the pair of local data I/O lines LIO/LIOB.

Although not shown in FIG. 5, the semiconductor memory device according to the present embodiments may further include an internal data transmission line precharge unit (not shown), which may precharge the pair of internal data transmission lines IDT/IDTB to a high level before and after the internal data transmission operation. The internal data transmission line precharge unit may be configured to operate in response to an internal control signal output by the memory controller 15.

Figure 6:
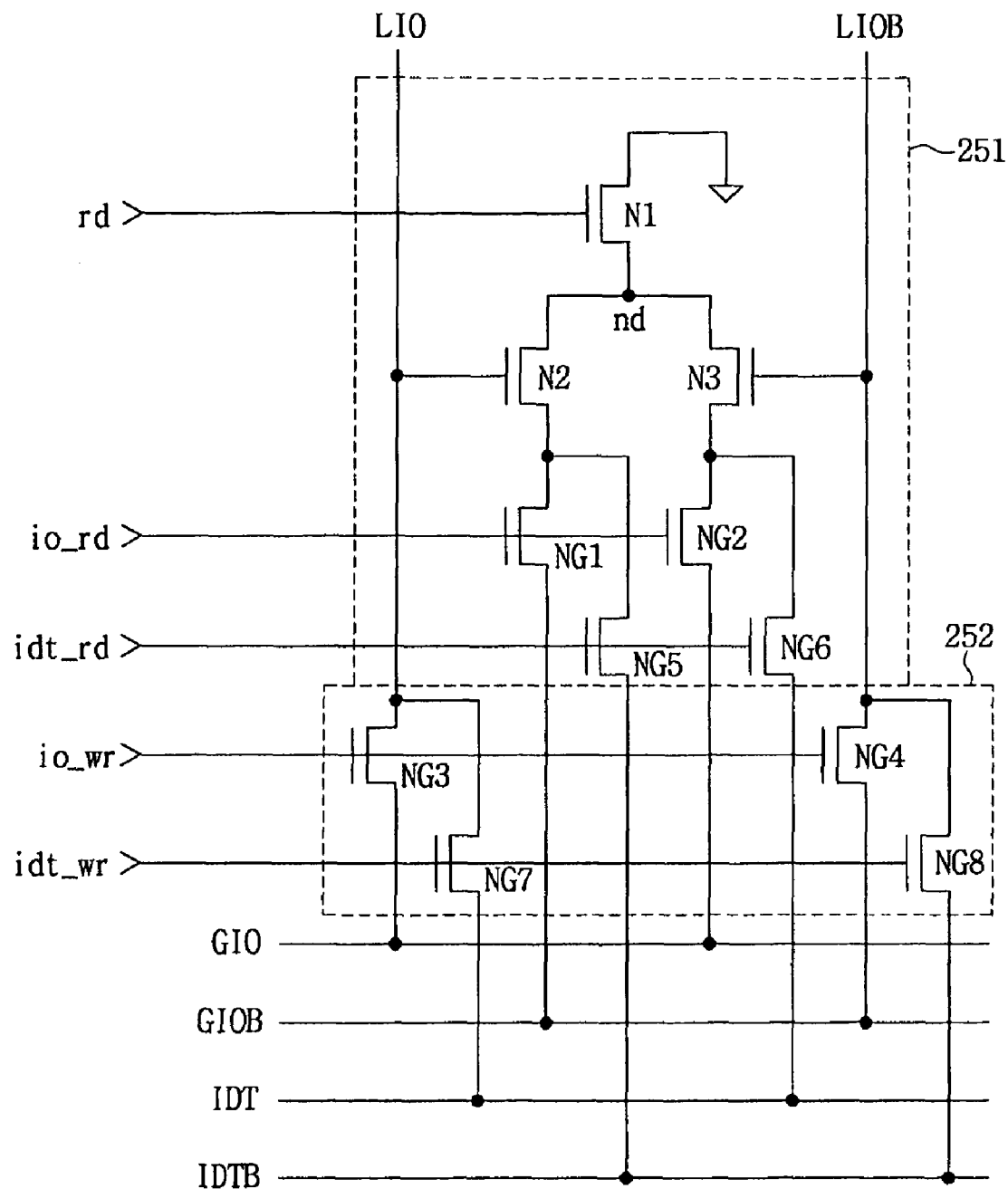
FIG. 6 is a construction diagram of a local sense amplifier of the semiconductor memory device of FIG. 5, according to example embodiments.

FIG. 6 is a construction diagram of the local sense amplification unit 25 of the semiconductor memory device of FIG. 5, according to example embodiments.

Referring to FIG. 6, the local sense amplification unit 25 may include a local sense amplifier 251 and a local global gate 252. Also, the local sense amplifier 251 may include first through third NMOS transistors N1, N2, and N3 and first, second, fifth, and sixth NMOS gate transistors NG1, NG2, NG5, and NG6. The first NMOS transistor N1 may be connected between a ground voltage and a node nd and have a gate to which a read signal rd is applied. The second NMOS transistor N2 may be connected to the node nd and have a gate to which a signal of the local data I/O line LIO is applied. The third NMOS transistor N3 may be connected to the node nd and have a gate to which a signal of the inverted local data I/O line LIOB is applied. The first NMOS gate transistor NG1 may be connected between the second NMOS transistor N2 and the inverted global data I/O line GIOB and have a gate to which an I/O read signal io_rd is applied. The second NMOS gate transistor NG2 may be connected between the third NMOS transistor N3 and the global data I/O line GIO and have a gate to which the I/O read signal io_rd is applied. The fifth NMOS gate transistor NG5 may be connected between the second NMOS transistor N2 and the inverted internal data transmission line IDTB and have a gate to which an internal data transmission read signal idt_rd is applied. The sixth NMOS gate transistor NG6 may be connected between the third NMOS transistor N3 and the internal data transmission line IDT and have a gate to which the internal data transmission read signal idt_rd is applied. In addition, the local global gate 252 may include third, fourth, seventh, and eighth NMOS gate transistors NG3, NG4, NG7, and NG8. The third NMOS gate transistor NG3 may be connected between the local data I/O line LIO and the global data I/O line GIO and have a gate to which an I/O write signal io_wr is applied. The fourth NMOS gate transistor NG4 may be connected between the inverted local data I/O line LIOB and the inverted global data I/O line GIOB and have a gate to which the I/O write signal io_wr is applied. The seventh NMOS gate transistor NG7 may be connected between the local data I/O line LIO and the internal data transmission line IDT and have a gate to which an internal data transmission write signal idt_wr is applied. The eighth NMOS gate transistor NG8 may be connected between the inverted local data I/O line LIOB and the inverted global data I/O line GIOB and have a gate to which the internal data transmission write signal idt_wr is applied. The read signal rd, the I/O read signal io_rd, the internal data transmission read signal idt_rd, the I/O write signal io_wr, and the internal data transmission write signal idt_wr may be output by the memory controller 10. Also, the read signal rd may be enabled to a high level when any one of the I/O read signal io_rd and the internal data transmission read signal idt_rd is enabled to a high level. The read signal rd may be generated by a logic gate to which the I/O read signal io_rd and the internal data transmission read signal idt_rd are applied.

Functions of respective blocks of FIG. 6 will now be described.

The local sense amplifier 251 may amplify data, which is transmitted to the pair of local data I/O lines LIO/LIOB, and transmit the amplified data to the pair of global data I/O lines GIO/GIOB in response to the read signal rd and the I/O read signal io_rd. Also, the local sense amplifier 251 may amplify data, which is transmitted to the pair of local data I/O lines LIO/LIOB, and the internal data transmission read signal idt_rd and transmit the amplified data to the pair of internal data transmission lines IDT/IDTB in response to the read signal rd. An operation of amplifying and transmitting data will be readily understood with reference to the description of FIG. 4.

The local global gate 252 may transmit data from the pair of global data I/O lines GIO and GIOB to the pair of local data I/O lines LIO/LIOB in response to the I/O write signal io_wr. Also, the local global gate 252 may transmit data from the pair of internal data transmission lines IDT/IDTB to the pair of local data I/O lines LIO and LIOB in response to the internal data transmission write signal idt_wr.

That is, the semiconductor memory device of FIGS. 5 and 6 according to the present embodiments may be configured to operate in nearly the same manner as the semiconductor memory device of FIGS. 1 through 4 according to the previous example embodiments, except that data can optionally transmitted through the additional pair of internal data transmission lines IDT/IDTB in addition to the pair of global data I/O lines GIO/GIOB during the internal data transmission operation. In other words, the memory controller 15 of the semiconductor memory device of FIGS. 5 and 6 may operate in the same manner as described with reference to FIGS. 1 through 4 except that the local sense amplification unit 25 is controlled during the internal data transmission operation to transmit data through the pair of internal data transmission lines IDT/IDTB.

As in the semiconductor memory device according to the previous example embodiments, in the semiconductor memory device according to the present embodiments, since data is transmitted through the additional pair of internal data transmission lines IDT/IDTB during the internal data transmission operation, the transmitted data is not externally output from the semiconductor memory device.

The semiconductor memory device according to the present embodiments can include the additional pair of internal data transmission lines IDT/IDTB and transmit data through the pair of internal data transmission lines IDT/IDTB during the internal data transmission operation so that an external apparatus can access a memory bank that does not participate in the internal data transmission operation. In this case, although not shown, the semiconductor memory device can include an additional address transmission line for transmitting an internal address output by the memory controller 16.

Figure 7:
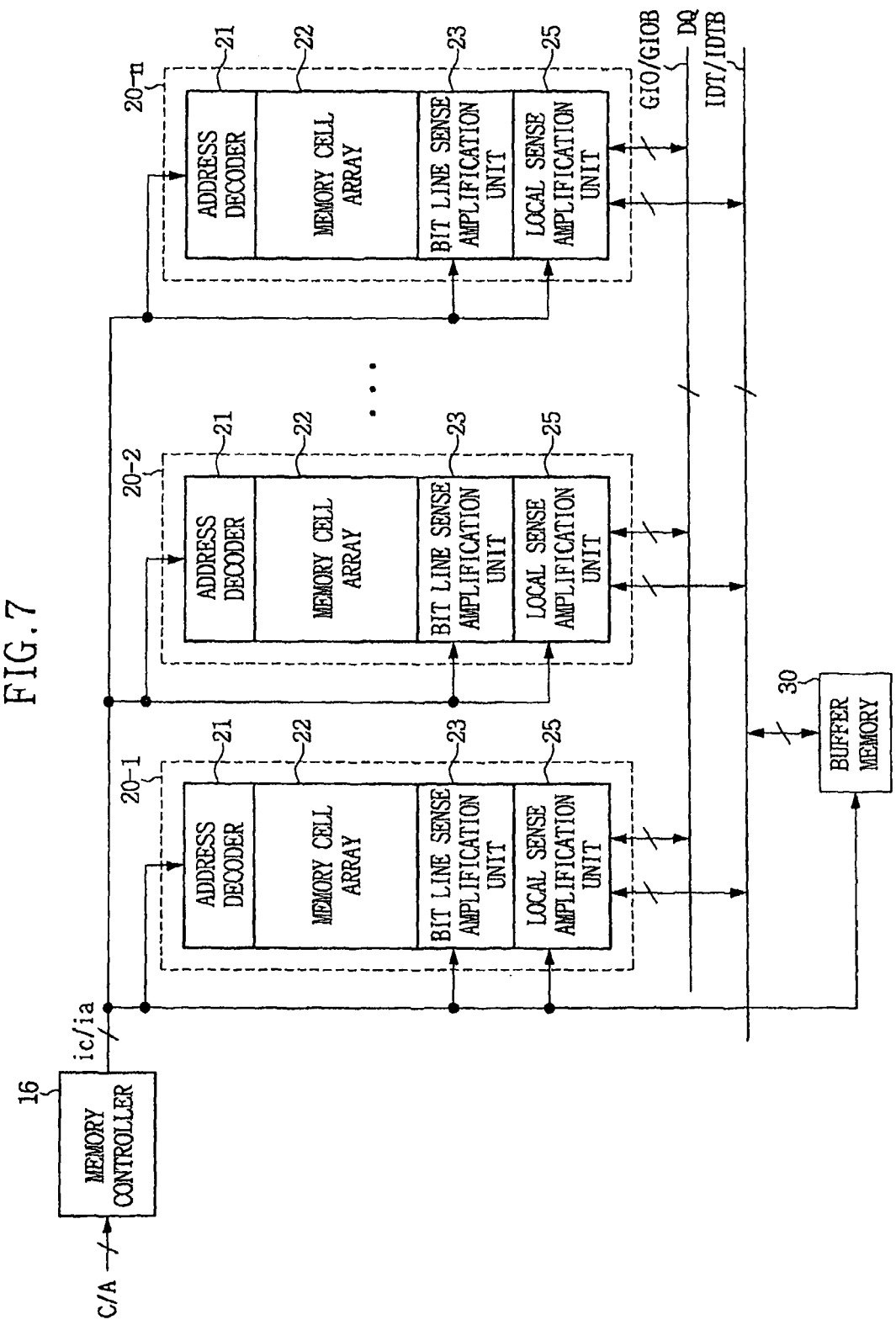
FIG. 7 is a construction diagram of a semiconductor memory device according to other example embodiments.

FIG. 7 is a construction diagram of a semiconductor memory device according to other example embodiments.

Referring to FIG. 7, the semiconductor memory device may include a memory controller 16, a plurality of memory banks 20-1, 20-2, . . . , and 20-n, and a buffer memory 30. Each of the plurality of memory banks 20-1, 20-2, . . . , and 20-n may include an address decoder 21, a memory cell array 22, a bit line sense amplification unit 23, and a local sense amplification unit 25. Also, the memory controller 16 may have nearly the same configuration as that shown in FIG. 2, and the bit line sense amplification unit 23 and the local sense amplification unit 25 may have the same configurations as in FIGS. 3 and 6, respectively.

Functions of respective blocks of FIG. 7 will now be described.

The functions of the memory controller 16 and each of the memory banks 20-1, 20-2, . . . , and 20-n will be readily understood with reference to the description of FIG. 1. Similarly, the functions of the address decoder 21, the memory cell array 22, the bit line sense amplification unit 23, and the local sense amplification unit 25 of each of the memory banks 20-1, 20-2, . . . , and 20-n will be readily understood with reference to the description of FIG. 5.

During an internal data transmission operation, the buffer memory 30 can be configured to temporarily store data, which is transmitted through the pair of internal data transmission lines IDT/IDTB, in response to internal control and address signals ic/ia output by the memory controller 16 and output the temporarily stored data through the pair of internal data transmission lines IDT/IDTB.

That is, the semiconductor memory device of FIG. 7 according to the present embodiments can be configured to operate in the same manner as the semiconductor memory device of FIGS. 5 and 6 during the internal data transmission operation except that the semiconductor memory device of FIG. 7 can additionally adopt the buffer memory 30 to perform the operation as a buffer rather than the bit line sense amplification unit 23 of one of the memory banks 20-1, 20-2, . . . , and 20-n performing the operation of a buffer.

Figure 8:
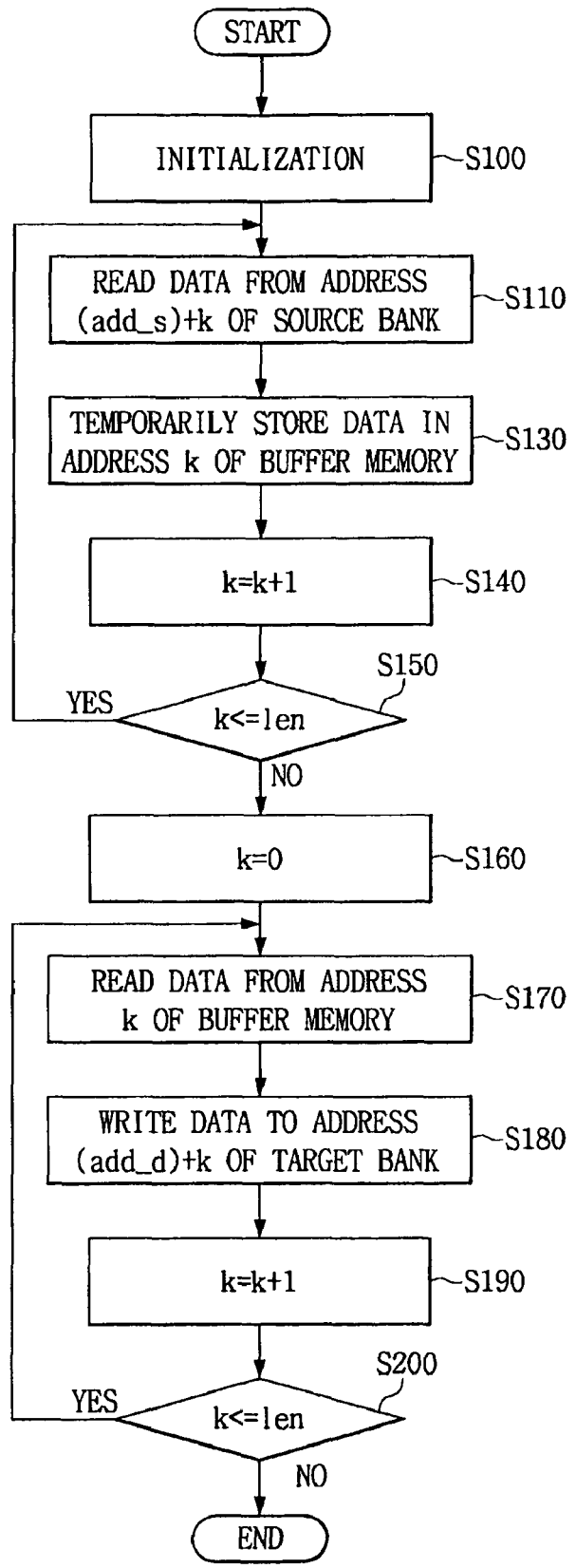
FIG. 8 is a flow chart illustrating a method of transmitting internal data of a semiconductor memory device according to example embodiments.

FIG. 8 is a flow chart illustrating a method of transmitting internal data of a semiconductor memory device according to example embodiments in which data to be copied is temporarily stored in a buffer.

A method of transmitting internal data of a semiconductor memory device according to the present example embodiments will now be described with reference to FIG. 8.

To begin, in operation S100, the memory controller 10, 15, or 16 may receive and store a start address (i.e., source address add_s) of a region in which data to be externally transmitted is stored, the transmission length len of the data to be transmitted, and a start address (i.e., target address add_d) of a region in which data to be transmitted will be stored. Also, an operation of resetting a constant k to 0 may be performed.

In operation S110, data may be read from the source address add_s+k of a memory bank (i.e., source bank) in which data to be transmitted is stored. In the semiconductor memory device of FIG. 1, the memory controller 10 may control the local sense amplification unit 24 to transmit the read data through the pair of global data I/O lines GIO/GIOB. In the semiconductor memory devices of FIGS. 5 and 7, the memory controller 15 or 16 may control the local sense amplification unit 25 of the source bank to transmit the read data through the pair of internal data transmission lines IDT/IDTB. Also, before the read data is transmitted, the memory controller 10, 15, or 16 may precharge the pair of global data I/O lines GIO/GIOB or the pair of internal data transmission lines IDT/IDTB to a high level.

In operation S130, the read data may be temporarily stored in the buffer. In the semiconductor memory devices of FIGS. 1 and 5, the read data may be temporarily stored in the bit line sense amplification unit 23 of one of memory banks other than a memory bank including a region corresponding to the source address add_s (i.e., memory bank in which data to be transmitted is stored) out of the plurality of memory banks 20-1, 20-2, . . . , and 20-n and a memory bank including a region corresponding to the target address add_d (i.e., memory bank in which the data will be stored). In the semiconductor memory device of FIG. 7, the read data may be temporarily stored in the buffer memory 30. The memory controller 10 or 15 may receive a signal indicating which of the memory banks 20-1, 20-2, . . . , and 20-n is selected to temporarily store data in the bit line sense amplification unit 23 from an external system controller or directly determine one of the memory banks 20-1, 20-2, . . . , and 20-n to temporarily store the data in the bit line sense amplification unit 23.

In operation S140, 1 may be added to the constant k.

In operation S150, it may be determined whether or not the constant k is less than or equal to the transmission length len.

When it is determined in operation S150 that the constant k is less than or equal to the transmission length len, operations S110 through S140 may be repeated for data stored in an address (add_s)+k obtained by adding the constant k to the source address add_s of the source bank. In other words, by repeating operations S110 through S140, data having a size corresponding to the transmission length len from the source address add_s may be read from the memory cell array 22 of the source bank and stored in the buffer (i.e., the bit line sense amplification unit 23 of a predetermined memory bank or the buffer memory 30).

When it is determined in operation S150 that the constant k is greater than the transmission length len, the constant k may be reset to 0 again in operation S160.

In operation S170, the temporarily stored data may be read from address k of the buffer. In the semiconductor memory devices of FIGS. 1 and 5, the memory controller 10 or 15 may control the local sense amplification unit 24 or 25 of the memory bank including the bit line sense amplification unit 23 used as the buffer to transmit the temporarily stored data through the pair of global data I/O lines GIO/GIOB or the pair of internal data transmission lines IDT/IDTB. In the semiconductor memory device of FIG. 7, the memory controller 16 may control the buffer memory 30 to transmit the data, which is stored in the address k of the buffer memory 30, through the pair of internal data transmission lines IDT/IDTB. Before the data is transmitted, the memory controller 10, 15, or 16 may precharge the pair of global data I/O lines GIO/GIOB or the pair of internal data transmission lines IDT/IDTB to a high level.

In operation S180, the data temporarily stored in the buffer may be written to the address (add_d)+k obtained by adding the constant k to the target address add_d of a memory bank (i.e., target bank) in which data to be copied will be stored. In the semiconductor memory devices of FIGS. 5 and 7, the memory controller 15 or 16 may control the local sense amplification unit 25 to transmit data, which is transmitted through the pair of internal data transmission lines IDT/IDTB, to the pair of local data I/O lines LIO/LIOB. That is, the memory controller 15 or 16 may enable the internal data transmission write signal idt_wr to a high level and connect the pair of internal data transmission lines IDT/IDTB with the pair of local data I/O lines LIO/LIOB.

In operation S190, 1 may be added to the constant k.

In operation S200, it may be determined whether or not the constant k is equal to or less than the transmission length len.

When it is determined in operation S200 that the constant k is less than or equal to the transmission length len, operations S170 through S190 may be repeated to write the data, which is temporarily stored in the buffer, to a desired region of the target bank.

When it is determined in operation S200 that the constant k is greater than the transmission length len, an internal data transmission operation may be finished.

FIG. 8 illustrates a case where the memory controller 10, 15, or 16 receives and stores the source address add_s and the target address add_d in operation S100. However, the memory controller 10, 15, or 16 may receive and store only the source address add_s in operation S100 and receive and store the target address add_d after data to be copied is temporarily stored in the buffer, that is, between operations S150 and S160.

Figure 9:
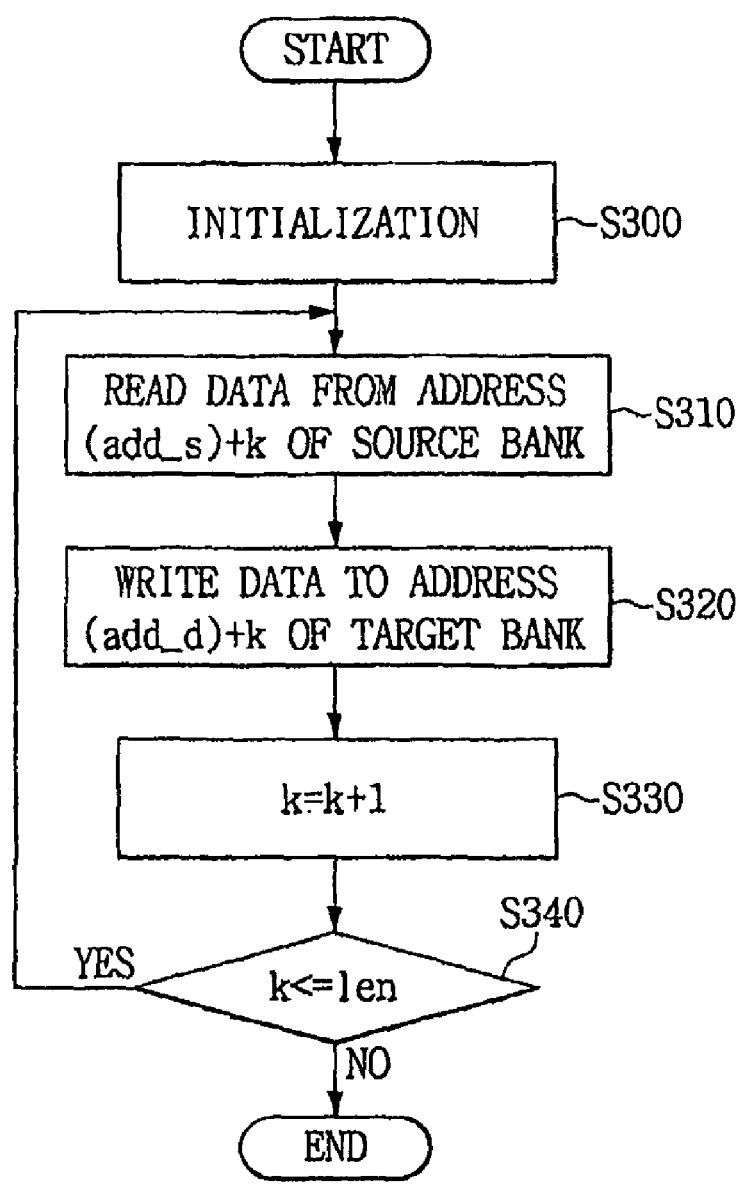
FIG. 9 is a flow chart illustrating a method of transmitting internal data of a semiconductor memory device according to other example embodiments.

FIG. 9 is a flow chart illustrating a method of transmitting internal data of a semiconductor memory device according to other example embodiments in which data is not temporarily stored in a buffer but directly transmitted.

A method of transmitting internal data of a semiconductor memory device according to the present example embodiments will now be described with reference to FIG. 9.

To begin, in operation S300, the memory controller 10, 15, or 16 may receive and store a start address (i.e., source address add_s) of a region in which data to be externally transmitted is stored, the transmission length len of the data to be transmitted, and a start address (i.e., target address add_d) of a region in which data to be transmitted will be stored. Also, an operation of resetting a constant k to 0 may be performed.

In operation S310, stored data may be read from the address (add_s)+k obtained by adding the constant k to the source address add_s of a memory bank (i.e., source bank) in which data to be transmitted is stored. In the semiconductor memory devices of FIGS. 5 and 7, the memory controller 15 or 16 may control the local sense amplification unit 25 of the source bank to transmit the read data through the pair of internal data transmission lines IDT/IDTB.

In operation S320, the read data may be stored in the address (add_d)+k obtained by adding the constant k to the target address add_d of a memory bank (i.e., target bank) in which data will be stored. In the semiconductor memory devices of FIGS. 5 and 7, the memory controller 15 or 16 may control the local sense amplification unit 25 to transmit data, which is transmitted through the pair of internal data transmission lines IDT/IDTB, to the pair of local data I/O lines LIO/LIOB. That is, the memory controller 15 or 16 may enable the internal data transmission write signal idt_wr to a high level and connect the pair of internal data transmission lines IDT/IDTB with the pair of local data I/O lines LIO/LIOB.

In operation S330, 1 may be added to the constant k.

In operation S340, it may be determined whether or not the constant k is less than or equal to the transmission length len.

When it is determined in operation S340 that the constant k is less than or equal to the transmission length len, operations S310 through S330 may be repeated. In other words, by repeating operations S310 through S340, data having a size corresponding to the transmission length len may be copied from the source bank to the target bank.

When it is determined in operation S340 that the constant k is greater than the transmission length len, an internal data transmission operation may be finished.

The method of transmitting the internal data of the semiconductor memory device as shown in FIG. 9 may be applied to a case where the source bank differs from the target bank.

As described above, the semiconductor memory device according to the example embodiments may transmit internal data therein without using external resources, such as a system memory bus or a memory controller, in order to enable a memory copy operation of copying data from a predetermined region of the semiconductor memory device to another region. Therefore, the semiconductor memory device may enable an efficient data transmission operation, and an external memory controller may write/read data to/from a memory bank that does not participate in the data transmission operation.

While example embodiments have been disclosed herein, it should be understood that other variations may be possible. Such variations are not to be regarded as a departure from the spirit and scope of example embodiments of the present application, and all such modifications as would be obvious to one skilled in the art are intended to be included within the scope of the following claims.

What is claimed is:

1. A semiconductor memory device comprising:
 a memory controller configured to, during an internal data transmission operation, externally receive and store a source address and a target address and output an internal control signal and an internal address signal using the source address and the target address in response to an externally applied command, the internal control signal including an internal write signal and an internal read signal;
 a pair of data lines on which transmission data is transmitted during the internal data transmission operation; and
 a plurality of memory banks configured to read the transmission data stored in a region corresponding to the source address and transmit the transmission data on the pair of data lines in response to the internal read signal, and to write the transmission data transmitted on the pair of data lines in response to the internal write signal,
 wherein, during the internal data transmission operation, the transmission data is transmitted from the region corresponding to the source address to a region corresponding to the target address, and is not output external to the semiconductor memory device.

2. The device of claim 1, wherein the pair of data lines comprise a global data I/O line and an inverted global data I/O line, and the transmission data is transmitted from the region corresponding to the source address to the region corresponding to the target address through the global data I/O line and the inverted global data I/O line during the internal data transmission operation.

3. The device of claim 2, wherein each of the plurality of memory banks comprises:
an address decoder configured to decode the internal address signal, and to drive word lines and column selection signal lines;
a memory cell array including memory cells connected between bit lines and inverted bit lines selected by the word lines and the column selection signal lines, respectively;
a bit line sense amplification unit including an NMOS sense amplifier and a PMOS sense amplifier, wherein the NMOS sense amplifier senses a high-level signal of the bit line or the inverted bit line and amplifies a signal of an inverted local data input/output (I/O) line or a local data I/O line to a low level, and the PMOS sense amplifier senses a low-level signal of the bit line or the inverted bit line and amplifies the signal of the inverted local data I/O line or the local data I/O line to a high level; and
a local sense amplification unit configured to sense the high-level signal of the local data I/O line or the inverted local data I/O line and amplify a signal of an inverted global data I/O line or a global data I/O line to a low level in response to the internal read signal, and connect the local data I/O line and the inverted local data I/O line with the global data I/O line and the inverted global data I/O line, respectively, in response to the internal write signal.

4. The device of claim 3, wherein the memory controller outputs the internal control signal and the internal address signal during the internal data transmission operation to read the transmission data from the region corresponding to the source address, to transmit the transmission data through the global data I/O line and the inverted global data I/O line to temporarily store the transmission data in the bit line sense amplification unit of the memory bank that does not include the region corresponding to the source address or the target address, and to transmit the temporarily stored transmission data through the global data I/O line and the inverted global data I/O line to write the data to the region corresponding to the target address.

5. The device of claim 1, further comprising an internal data transmission line and an inverted internal data transmission line, wherein the pair of data lines are the internal data transmission line and the inverted internal data transmission line, and the transmission data is transmitted from the region corresponding to the source address to a region corresponding to the target address through the internal data transmission line and the inverted internal data transmission line during the internal data transmission operation.

6. The device of claim 5, wherein the memory controller further outputs a normal read signal and a normal write signal in response to the command during a normal operation,
wherein each of the plurality of memory banks comprises:
an address decoder configured to decode the internal address signal and to drive word lines and column selection signal lines;
a memory cell array including memory cells connected between bit lines and inverted bit lines selected by the word lines and the column selection signal lines, respectively;
a bit line sense amplification unit including an NMOS sense amplifier and a PMOS sense amplifier, wherein the NMOS sense amplifier senses a high-level signal of the bit line or the inverted bit line and amplifies a signal of an inverted local data I/O line or a local data I/O line to a low level, and the PMOS sense amplifier senses a low-level signal of the bit line or the inverted bit line and amplifies the signal of the inverted local data I/O line or the local data I/O line to a high level; and
a local sense amplification unit including a local sense amplifier and a local global gate, wherein the local sense amplifier is configured to sense a high-level signal of the local data I/O line or the inverted local data I/O line and amplify a signal of an inverted global data I/O line or a global data I/O line to a low level in response to the normal read signal during the normal operation, and configured to sense the high-level signal of the local data I/O line or the inverted local data I/O line and amplify a signal of the inverted internal data transmission line or the internal data transmission line to a low level in response to the internal read signal during the internal data transmission operation, and the local global gate is configured to connect the local data I/O line and the inverted local data I/O line with the global data I/O line and the inverted global data I/O line, respectively, in response to the normal write signal during the normal operation, and configured to connect the local data I/O line and the inverted local data I/O line with the internal data transmission line and the inverted internal data transmission line, respectively, in response to the internal write signal during the internal data transmission operation.

7. The device of claim 6, wherein the memory controller outputs the internal control signal and the internal address signal during the internal data transmission operation to read the transmission data from the region corresponding to the source address, to transmit the transmission data through the internal data transmission line and the inverted internal data transmission line to temporarily store the transmission data in the bit line sense amplification unit of the memory bank that does not include the region corresponding to the source address or the target address, and to transmit the temporarily stored transmission data through the internal data transmission line and the inverted internal data transmission line to write the data to the region corresponding to the target address.

8. The device of claim 7, further comprising a buffer memory connected to the internal data transmission line and the inverted internal data transmission line,
wherein the memory controller outputs the internal control signal and the internal address signal to read the transmission data from the region corresponding to the source address, transmit the transmission data through the internal data transmission line and the inverted internal data transmission line to temporarily store the transmission data in the buffer memory, and transmit the temporarily stored transmission data through the internal data transmission line and the inverted internal data transmission line to write the data to the region corresponding to the target address.

9. The device of claim 1, wherein the memory controller comprises:
an address register configured to externally receive an address signal in response to the command and store the source address and the target address; and
a command decoder configured to output the internal control signal and the internal address signal using the source address and the target address, which are stored in the address register, in response to the command.

10. The device of claim 9, wherein the memory controller further comprises:
- a transmission length register configured to receive the address signal in response to the command and store a transmission length to determine the size of the transmission data; and
- a mode register configured to receive the address signal in response to the command and store a mode control signal to determine whether or not an internal data transmission function is to be used,
- wherein the command decoder further employs the transmission length and the mode control signal and outputs the internal control signal and the internal address signal.

11. A method of transmitting internal data in a semiconductor memory device comprising a memory controller and a plurality of memory banks, the method comprising:
- externally receiving a source address and a target address and storing the source address and the target address in the memory controller in response to an externally applied command;
- reading transmission data stored in a region corresponding to the source address out of the plurality of memory banks and transmitting the transmission data to a pair of data lines; and
- writing the transmission data transmitted to the pair of data lines to a region corresponding to the target address out of the plurality of memory banks,
- wherein the transmission data is not output external to the semiconductor memory device.

12. The method of claim 11, wherein reading the transmission data comprises transmitting the transmission data through a pair of global data I/O lines, and
- writing the transmission data comprises writing the transmission data transmitted through the pair of global data I/O lines.

13. The method of claim 11, wherein the semiconductor memory device further comprises a pair of internal data transmission lines configured to transmit internal data,
- wherein reading the transmission data comprises transmitting the transmission data through the pair of internal data transmission lines, and writing the transmission data comprises writing the transmission data transmitted through the pair of internal data transmission lines.

14. The method of claim 11, further comprising temporarily storing the transmission data transmitted through the pair of data lines in a bit line sense amplifier of a memory bank, which does not include the region corresponding to the source address or the target address, out of the plurality of memory banks and transmitting the temporarily stored transmission data through the pair of data lines in reading the transmission data.

15. The method of claim 14, wherein reading the transmission data comprises transmitting the transmission data through a pair of global data I/O lines,
- temporarily storing the transmission data comprises temporarily storing the transmission data transmitted through the pair of global data I/O lines and transmitting the temporarily stored transmission data through the pair of global data I/O lines, and
- writing the transmission data comprises writing the transmission data transmitted through the pair of global data I/O lines.

16. The method of claim 14, wherein the semiconductor memory device further comprises a pair of internal data transmission lines configured to transmit internal data,
- wherein reading the transmission data comprises transmitting the transmission data through the pair of internal data transmission lines,
- temporarily storing the transmission data comprises temporarily storing the transmission data transmitted through the pair of internal data transmission lines and transmitting the temporarily stored transmission data through the pair of internal data transmission lines, and
- writing the transmission data comprises writing the transmission data transmitted through the pair of internal data transmission lines.

17. The method of claim 11, wherein the semiconductor memory device further comprises a buffer memory connected to the pair of data lines,
- the method further comprising temporarily storing the transmission data transmitted through the pair of data lines in the buffer memory and transmitting the temporarily stored transmission data through the pair of data lines.

18. The method of claim 17, wherein the semiconductor memory device further comprises a pair of internal data transmission lines configured to transmit internal data,
- wherein reading the transmission data comprises transmitting the transmission data through the pair of internal data transmission lines,
- temporarily storing the transmission data comprises temporarily storing the transmission data transmitted through the pair of internal data transmission lines and transmitting the temporarily stored transmission data through the pair of internal data transmission lines, and
- writing the transmission data comprises writing the transmission data transmitted through the pair of internal data transmission lines.

19. The method of claim 11, wherein reading the transmission data comprises:
- transmitting the transmission data stored in the region corresponding to the source address to a pair of bit lines, amplifying signals of the pair of bit lines, and transmitting the amplified signals of the pair of bit lines through a pair of local data I/O lines; and
- amplifying the transmission data transmitted through the pair of local data I/O lines and transmitting the amplified transmission data through the pair of data lines, and
- wherein writing the transmission data comprises:
- transmitting the transmission data transmitted through the pair of data lines to the pair of local data I/O lines; and
- transmitting the transmission data transmitted through the pair of local data I/O lines to the pair of bit lines and writing the transmission data to the region corresponding to the target address.

20. The method of claim 11, wherein externally receiving the source and target addresses in response to the externally applied command comprises receiving and storing a transmission length used to determine the size of the transmission data and a mode control signal used to determine whether or not an internal data transmission function is to be used in response to the command.

* * * * *